(12) United States Patent
Oesterwind

(10) Patent No.: US 10,819,323 B1
(45) Date of Patent: Oct. 27, 2020

(54) METHOD FOR DEBOUNCING AN ELECTRICAL INPUT SIGNAL, AND DEBOUNCING MODULE

(71) Applicant: ZF Automotive Germany GmbH, Alfdorf (DE)

(72) Inventor: Tobias Oesterwind, Düsseldorf (DE)

(73) Assignee: ZF Automotive Germany GmbH, Alfdorf (DE)

( * ) Notice: Subject to any disclaimer, the term of this patent is extended or adjusted under 35 U.S.C. 154(b) by 0 days.

(21) Appl. No.: 16/843,739

(22) Filed: Apr. 8, 2020

(30) Foreign Application Priority Data

Apr. 11, 2019 (DE) .................. 10 2019 109 653

(51) Int. Cl.
*H03K 17/16* (2006.01)
*H03K 5/1254* (2006.01)

(52) U.S. Cl.
CPC .................. *H03K 5/1254* (2013.01)

(58) Field of Classification Search
CPC .... H03K 5/1252; H03K 5/1254; H03K 3/013; H03K 3/015; G04G 5/005
See application file for complete search history.

(56) References Cited

U.S. PATENT DOCUMENTS 9,680,458 B1 * 6/2017 Windley ............. H03K 21/026
2008/0297205 A1 12/2008 Taylor

FOREIGN PATENT DOCUMENTS

DE 102005059128 A1 6/2007
DE 102009011623 A1 9/2010

* cited by examiner

*Primary Examiner* — An T Luu
(74) *Attorney, Agent, or Firm* — Gigette M. Bejin

(57) ABSTRACT

A method for debouncing an electrical input signal ($x_{in}$) includes following steps: (1) an input signal ($x_{in}$) is received and a present value of the input signal ($x_{in}$) is ascertained; (2) ascertaining whether the present value of the input signal ($x_{in}$) is above or below at least one predefined limit value ($x_G$); (3) producing a debounce status variable ($x_E$) having a defined initial value; (4) altering the value of the debounce status variable ($x_E$) on the basis of at least whether the value of the input signal ($x_{in}$) is above or below the at least one limit value ($x_G$), (5) generating an output signal ($x_{out}$) on the basis of whether the value of the debounce status variable ($x_E$) corresponds to the minimum value ($W_{min}$), to the maximum value ($W_{max}$) or to a value between the minimum value ($W_{min}$) and the maximum value ($W_{max}$).

11 Claims, 3 Drawing Sheets a)

b)

METHOD FOR DEBOUNCING AN ELECTRICAL INPUT SIGNAL, AND DEBOUNCING MODULE

CROSS-REFERENCE TO RELATED APPLICATION

This application claims priority to German Patent Application No. 102019109653.7, filed Apr. 11, 2019, the disclosure of which is incorporated herein by reference in its entirety.

TECHNICAL HELD

The invention relates to a method for debouncing an electrical input signal and to a debouncing module.

BACKGROUND

Electrical signals in general and electrical signals from sensors specifically can be described as a superimposition comprising an ideal, interference-free signal and additional interference Said interference typically has a randomly distributed component that is described as additive white Gaussian noise, for example. As a result, the electrical signal has high-frequency interference superimposed on it. The interference thus alters the electrical signal, so that it differs from the ideal signal.

In many different situations, it is necessary to ascertain whether the interference-free electrical signal is above or below a predefined limit value. This often involves a binary output signal being produced, the value of which is dependent on whether the interference-free electrical signal is above or below a predefined limit value.

Particularly in immediate surroundings of the limit value, however, the interference described above results in the electrical signal changing between the range above the limit value and the range below the limit value at a very high frequency and hence in what is known as bouncing occurring. It is therefore difficult to decide whether the interference-free signal is above or below the limit value or exceeds the limit value. Accordingly, the value of the output signal produced in this limit range would jump to and from between the two possible values at a high frequency (this phenomenon is also referred to as "toggling").

The prior art reveals methods in which the electrical signal is debounced by virtue of the value of the output signal being changed only when the electrical signal is continuously above or below the limit value for a predefined period. This approach can lead to long delays, however, particularly in the case of a very noisy signal, since the electrical signal repeatedly exceeds the limit value, if only briefly.

SUMMARY

It is thus an object of the invention to provide a method for debouncing an electrical input signal and a debouncing module that allow even very noisy electrical signals to be debounced with short delay times.

The object is achieved according to the invention by a method for debouncing an electrical input signal, having the following steps:
receiving the input signal;
ascertaining a present value of the input signal;
ascertaining whether the present value of the input signal is above or below at least one predefined limit value;
producing a debounce status variable having a defined initial value;
altering the value of the debounce status variable on the basis of at least whether the value of the input signal is above or below the at least one limit value, wherein the value of the debounce status variable is alterable between a minimum value and a maximum value; and
generating an output signal on the basis of whether the value of the debounce status variable corresponds to the minimum value, to the maximum value or to a value between the minimum value and the maximum value.

The method according to the invention is based on the basic idea of introducing an additional variable, namely the debounce status variable, which is a measure of how likely it is that the actual value of the electrical input signal is above or below the limit value.

In contrast to the prior art, a timer is thus not reset each time the electrical input signal exceeds the limit value, but rather the value of the debounce status variable is continually adjusted.

For a change in the value of the output signal, it is therefore sufficient if the present value of the input signal is one side of the limit value for long enough on the whole over a certain period. It is thus no longer necessary for the present value of the input signal to be continuously one side of the limit value over the certain period.

The influence of brief, that is to say high-frequency, fluctuations is reduced thereby and the electrical signal is debounced with shorter delays.

Preferably, the initial value of the debounce status variable is determined on the basis of the present value of the input signal. To be more precise, the initial value is set equal to the minimum value if the present value of the input signal is less than the limit value, and is set equal to the maximum value if the present value of the input signal is greater than the limit value. Alternatively, the initial value of the debounce status variable may also be prescribed, however, for example as the minimum value or as the maximum value.

By way of example, the minimum value is equal to zero and the maximum value is equal to one. Naturally, however, any other isolated range can also be used.

In particular, the electrical input signal is a measurement signal from a sensor or an already further-processed measurement signal from a sensor. By way of example, the electrical input signal is the signal from a torque sensor, from an angle position sensor, from a temperature sensor, from a voltage sensor, from a current sensor and/or from a force sensor. The applicable sensor from which the input signal originates may be part of a steering system for a motor vehicle.

In accordance with one configuration of the invention, the output signal is a binary signal. The output signal thus has two possible values corresponding to the interpretations "electrical input signal above the limit value" and "electrical input signal below the limit value".

Preferably, the value of the output signal is altered if the value of the debounce status variable reaches the minimum value or the maximum value. In this case, the minimum value corresponds to the interpretation that the electrical input signal is below the limit value, which is why the reaching of the minimum value is followed by an output signal being output that corresponds to this state. Analogously, the maximum value corresponds to the interpretation that the electrical input signal is above the limit value, which is why the reaching of the maximum value is followed by an output signal being output that corresponds to this state.

A further aspect of the invention provides for the present value of the output signal to be maintained for as long as the value of the debounce status variable is between the minimum value and the maximum value. Expressed another way, the output signal is thus altered only if the debounce status variable reaches one of its two extreme values, that is to say the minimum value or the maximum value. This reliably prevents the value of the output signal from changing at a high frequency, in particular from jumping to and fro at a high frequency.

In accordance with a further configuration of the invention, the value of the debounce status variable is raised with a predefined first gradient if the ascertained present value of the input signal is above the at least one limit value, and/or the value of the debounce status variable is lowered with a predefined second gradient if the ascertained present value of the input signal is below the at least one limit value. The first and second gradients may be equal to or different from one another.

At this juncture and below, the term "predefined gradient" means that the first gradient and/or the second gradient are at least stipulated, that is to say constant, or are ascertained by the signal processing unit on the basis of stipulated criteria.

Preferably, the first gradient and/or the second gradient are or is ascertained on the basis of how far the present value of the input signal is above or below the at least one limit value. As a result, there is more weight to values of the input signal that are very far away from the limit value and thus give a greater indication that the input signal is on a specific side of the limit value.

More preferably, the magnitude of the value of the first gradient and/or of the second gradient is greater the further away the present value of the input signal is from the at least one limit value. As a result, the value of the debounce status variable is altered more quickly if the present value of the input signal is further away from the limit value, as a result of which the delays when debouncing the input signal are reduced further.

In accordance with a further configuration of the invention, the first gradient and/or the second gradient is ascertained on the basis of a characteristic curve, wherein the characteristic curve assigns a gradient to the value of the input signal. Expressed another way, the gradient of the debounce status variable is then thus a function of the distance of the present value of the input signal from the limit value, preferably a monotonously rising function, in particular a stringently monotonously rising function. The function in this case may be continuous or discontinuous. By way of example, the characteristic curve can have staircase-shaped sudden changes.

A further aspect of the invention provides for there to be provision for at least one primary and one secondary first gradient and also at least one predetermined positive limit value above the at least one limit value, wherein the value of the debounce status variable is raised with the primary first gradient if the ascertained present value of the input signal is below the at least one positive limit value but above the at least one limit value and wherein the value of the debounce status variable is raised for the secondary first gradient if the ascertained present value of the input signal is above the at least one positive limit value, and/or in that there is provision for at least one primary and one secondary second gradient and also at least one predetermined negative limit value below the at least one limit value, wherein the value of the debounce status variable is lowered with the primary second gradient if the ascertained present value of the input signal is above the at least one negative limit value but below the at least one limit value and wherein the value of the debounce status variable is lowered with the secondary second gradient if the ascertained present value of the input signal is below the at least one negative limit value.

Expressed another way, the at least one limit value, the positive limit value and the negative limit value define multiple bands that each correspond to a predefined gradient of the debounce status variable. In particular, the gradient is constant within the individual bands but different between the individual bands.

There may be provision for a second predefined limit value, wherein the value of the debounce status variable is maintained for as long as the present value of the input signal is between the two limit values. The two limit values thus bound a dead band as it were, within which the value of the debounce status variable does not change. As such, a dead band can be implemented in a simple manner.

In particular, the value of the debounce status variable is raised with the first gradient if the ascertained present value of the input signal is above the greater of the two limit values and/or the value of the debounce status variable is lowered with the second gradient if the ascertained present value of the input signal is below the smaller of the two limit values. The at least one limit value is thus replaced by a dead band as it were, wherein the value of the debounce status variable is raised if the present value of the input signal is above the dead band, and is lowered if the present value of the input signal is below the dead band.

The object is furthermore achieved according to the invention by a debouncing module, in particular a controller, having a signal input for receiving an input signal, a signal output for outputting an output signal and a signal processing unit, wherein the signal processing unit is configured to perform a method as described above. In consideration of the advantages and features, reference is made to the explanations above in consideration of the method, which accordingly also apply to the debouncing module, and vice versa.

BRIEF DESCRIPTION OF THE DRAWINGS

Further advantages and properties of the invention are obtained from the description below and the accompanying drawings, to which reference is made and in which.

DETAILED DESCRIPTION

Figure 1:
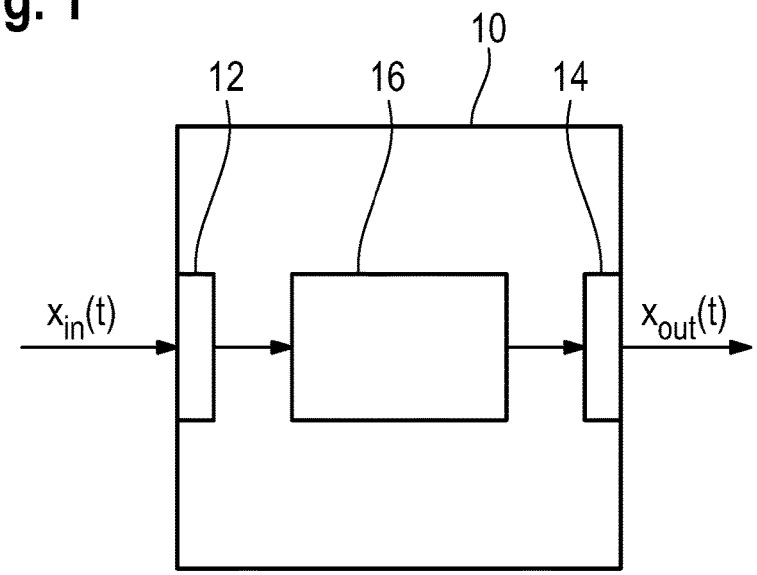
FIG. 1 schematically shows a block diagram of a debouncing module according to the invention.

FIG. 1 shows a debouncing module 10 that has a signal input 12 for receiving an electrical input signal $x_{in}(t)$, a signal output 14 for outputting an electrical output signal $x_{out}(t)$ and a signal processing unit 16.

The signal processing unit 16 is arranged in a manner connected downstream of the signal input 12 and is connected to the signal input 12 in signal-transmitting fashion. Further, the signal processing unit 16 is arranged in a manner connected upstream of the signal output 14 and is connected to the signal output 14 in signal-transmitting fashion.

Expressed in a general way, the signal processing unit 16 is designed to receive the electrical input signal $x_{in}$ via the signal input 12, to process the input signal $x_{in}$ and to generate the output signal $x_{out}$ on the basis of the input signal $x_{in}$.

Figure 2:
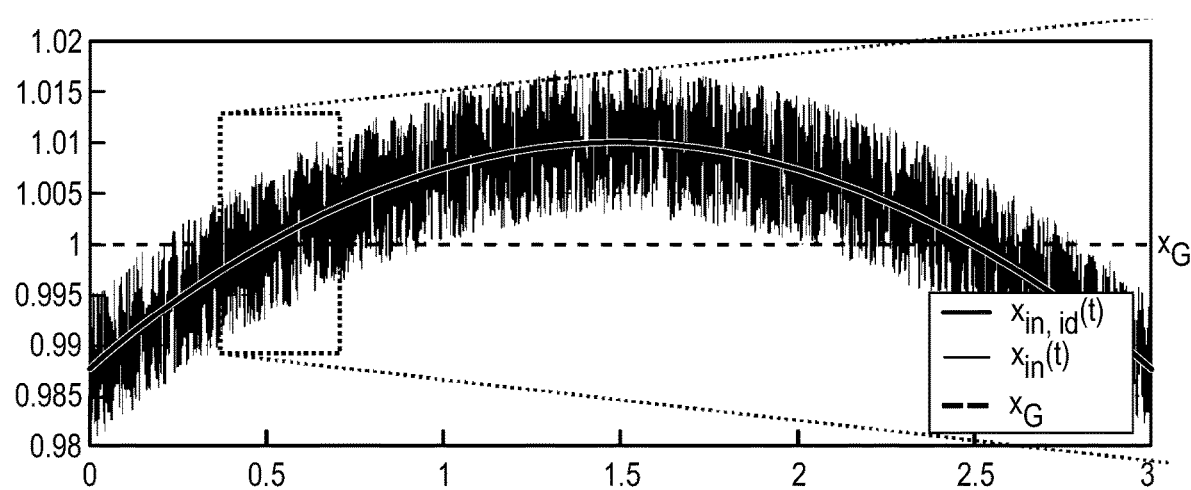
FIG. 2 shows a graph of an electrical input signal plotted against time.

FIG. 2 shows an exemplary depiction of the input signal $x_{in}(t)$ in a manner plotted against time t. The input signal $x_{in}$ is a superimposition comprising an interference-free signal $x_{in,id}$ and interference, so that the value of the input signal $x_{in}$ at least intermittently differs from the value of the interference-free signal $x_{in,id}$. This interference may be random, that is to say can have a Gaussian distribution. However, the interference can also have deterministic components.

In particular, the electrical input signal $x_{in}(t)$ is a measurement signal from a sensor or is an already further-processed measurement signal from a sensor. By way of example, the electrical input signal $x_{in}(t)$ is the signal from a torque sensor, from an angle position sensor, from a temperature sensor, from a voltage sensor, from a current sensors and/or from a force sensor.

The applicable sensor from which the input signal $x_{in}$ originates may be part of a steering system for a motor vehicle.

Accordingly, the debouncing module 10 may be part of a controller of a motor vehicle or of an applicable subsystem of a motor vehicle.

Further, the input signal $x_{in}$ is an analog signal or a digital signal, in particular a binary signal.

For many different applications, the signal processing unit 16 needs to ascertain whether a value of the interference-free signal $x_{in,id}$ is above or below a predefined limit value $x_G$. It should be pointed out that the input signal $x_{in}$ in FIG. 2 is indicated in units of the limit value $x_G$, which is why the value of the limit value $x_G$ is one.

The output signal $x_{out}$ is then a binary signal that is produced by the signal processing unit 16 with one or two possible different values, specifically depending on whether the value of the interference-free input signal $x_{in,id}$ is above or below the limit value $x_G$. The two different possible values of the output signal $x_{out}$ are denoted by E and $\bar{E}$ below.

If the input signal $x_{in}$ as shown in FIG. 2, has high-frequency noise of non-negligible amplitude, it is difficult to determine whether the value of the interference-free signal $x_{in,id}$ is above or below the limit value $x_G$.

Figure 3:
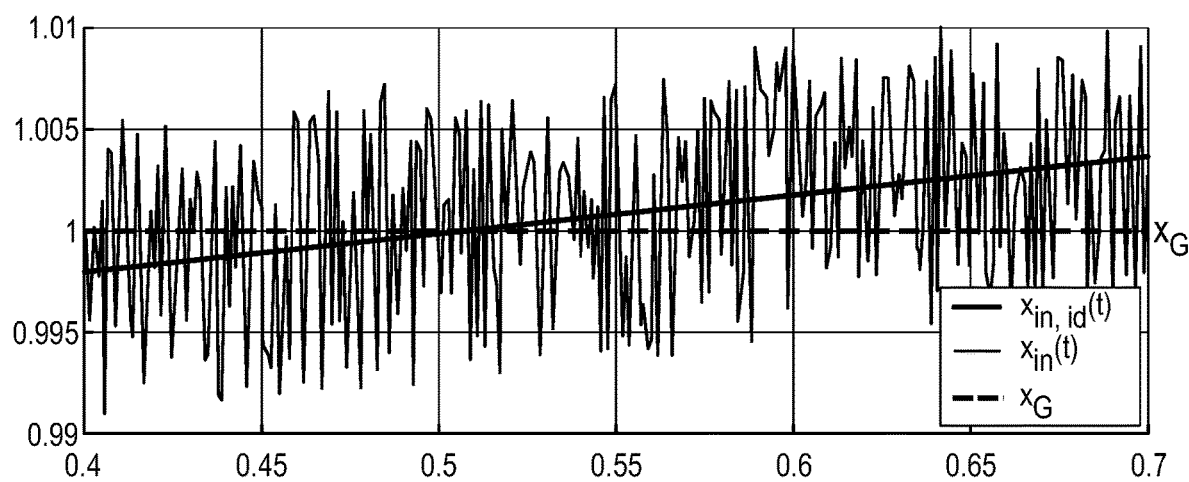
FIG. 3 shows (a) an enlarged detail from the electrical input signal of FIG. 2 and (b) a graph of a resulting output signal in the absence of debouncing for the input signal.
Figure 3:
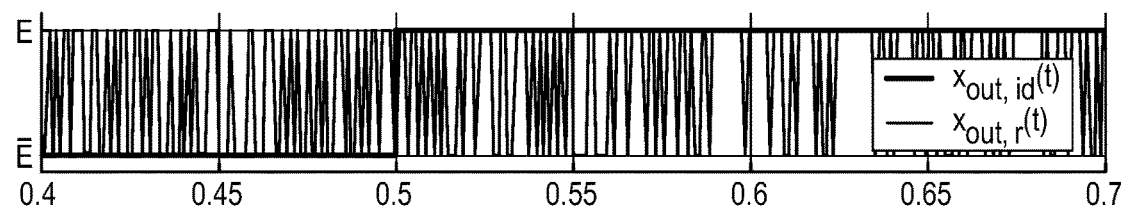

This is illustrated once again in more detail in FIGS. 3(*a*) and (*b*). FIG. 3(*a*) shows an enlargement of the range surrounded by dots from FIG. 2 and FIG. 3(*b*) shows the applicable resulting value of the output signal $x_{out}$.

For the interference-free input signal $x_{in,id}$, an interference-free output signal $x_{out,id}$ is obtained that has a single, step-shaped transition from E to $\bar{E}$.

For the actual input signal $x_{in}$, on the other hand, a greatly fluctuating output signal $x_{out,r}$ would be obtained without further processing of the input signal $x_{in}$ on account of the noise component.

To produce a stable output signal, the input signal $x_{in}$ is thus processed by the debouncing module 10, to be more precise by the signal processing unit 16.

Expressed in a general way, the debouncing module 10 is designed to debounce the input signal $x_{in}$ and to take the input signal $x_{in}$ as a basis for producing the output signal $x_{out}$. The output signal $x_{out}$ is thus a binary signal having values E and $\bar{E}$ that corresponds to the debounced input signal $x_{in}$.

Figure 4:
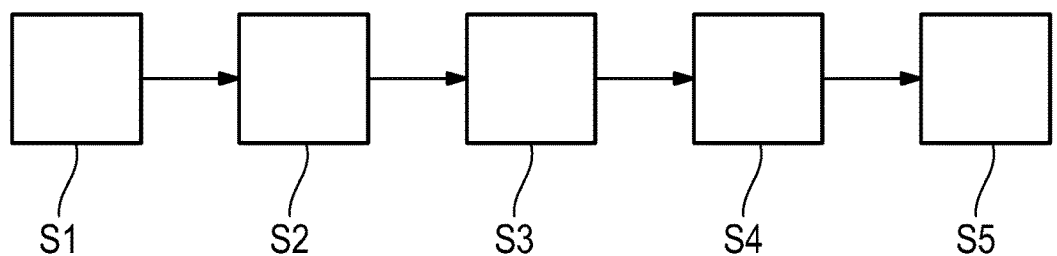
FIG. 4 schematically shows a flowchart for a method according to the invention for debouncing the electrical input signal.

To be more precise, the debouncing module 10 is designed to perform the method for debouncing the electrical input signal $x_{in}$ that is described below with reference to FIGS. 4 to 6.

First, the electrical input signal $x_{in}$ is received via the signal input 12 and forwarded to the signal processing unit 16 (step S1).

A present value of the input signal $x_{in}$ is then ascertained (step S2). At this juncture and below, the "present value" should be understood to mean a measurable signal parameter, for example a present amplitude or a present power of the input signal $x_{in}$.

In step S2, the present value of the input signal $x_{in}$ is additionally compared with the limit value $x_G$. This involves ascertaining whether the present value of the input signal $x_{in}$ is above or below the limit value $x_G$.

Additionally, a debounce status variable $x_E$ is produced having a predefined initial value (step S3). The predefined initial value is in a predefined range bounded by a minimum value $W_{min}$ and a maximum value $W_{max}$. In particular, $W_{min}$ is equal to zero and $W_{max}$ is equal to 1. Naturally, any other isolated range can also be used, however.

The initial value of the debounce status variable $x_E$ is determined on the basis of the present value of the input signal $x_{in}$. To be more precise, the initial value is set equal to $W_{min}$ if the present value of the input signal $x_{in}$ is less than the limit value $x_G$, and is set equal to $W_{max}$ if the present value of the input signal $x_{in}$ is greater than the limit value $x_G$.

Alternatively, the initial value of the debounce status variable $x_E$ may also be prescribed, however, for example as zero or as one.

On the basis of the present value of the input signal $x_{in}$, the value of the debounce status variable $x_E$ is altered (step S4). To be more precise, the value of the debounce status variable $x_E$ is raised with a predefined first gradient if the ascertained present value of the input signal $x_{in}$ is above the limit value $x_G$. Analogously, the value of the debounce status variable $x_E$ is lowered with a second predefined gradient if the ascertained present value of the input signal $x_{in}$ is below the limit value $x_6$.

The debounce status variable $x_E$ is always in the predefined range. It thus cannot become less than the minimum value $W_{min}$ or become greater than the maximum value $W_{max}$.

At this juncture and below, "predefined gradient" means that the first gradient and/or the second gradient are already stipulated, that is to say constant, or are ascertained by the signal processing unit 16 on the basis of stipulated criteria.

Figure 5:
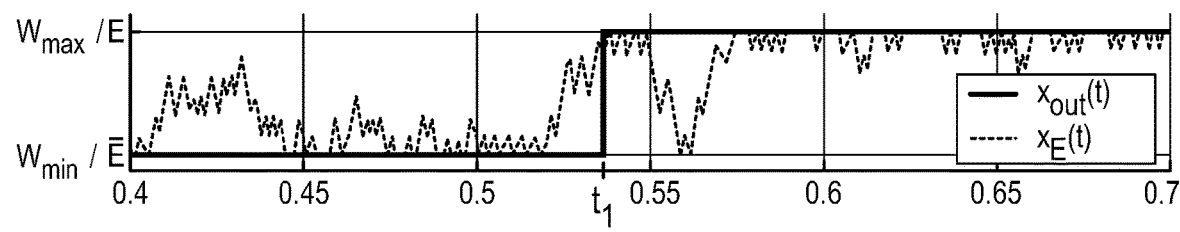
FIG. 5 shows a graph of an output signal, debounced in accordance with the method according to the invention from FIG. 4; plotted again time.

In FIG. 5, the resulting debounce status variable $x_E(t)$ is plotted against time. The magnitude of the value of the first gradient and the magnitude of the value of the second gradient are equal in this case and independent of how far the present value of the input signal $x_{in}$ is above or below the limit value $x_G$.

Alternatively, the first gradient and the second gradient, to be more precise the magnitudes thereof, may also be different from one another.

Additionally, the first and/or the second gradient may be dependent on how far away the present value of the input signal $x_{in}$ is from the limit value $x_G$. The gradient of the debounce status variable is then thus a function of the distance of the present value of the input signal $x_{in}$ from the limit value $x_G$, that is to say $$m = f(x_{in}(t) - x_G),$$

where in denotes the gradient. Expressed another way, the gradient of the debounce status variable $x_E$ is thus ascertained on the basis of a characteristic curve and/or another computation code, the characteristic curve and/or the computation curve being defined by the function $f(x_{in}(t) - x_G)$.

Preferably, $f$ is a monotonously rising function having a zero crossing at $x_{in}(t) = x_G$, so that the magnitude of the gradient is greater the further away the present value of the input signal $x_{in}$ is from the limit value $x_G$.

The output signal $x_{out}$ is produced on the basis of whether the value of the debounce status variable $x_E$ is equal to the minimum value $W_{min}$, is equal to the maximum value $W_{max}$ or corresponds to a value between the minimum value $W_{min}$ and the maximum value $W_{max}$ (step S5).

As can be seen in FIG. 5, the value of the output signal $x_{out}$ remains unaltered for as long as the value of the debounce status variable $x_E$ is between the minimum value $W_{min}$ and the maximum value $W_{max}$.

When the debounce status variable $x_E$ reaches the maximum value $W_{max}$, however, which is the case at the time $t_1$ in FIG. 5, the value of the output signal $x_{out}$ is changed to E.

Analogously, the value of the output signal $x_{out}$ is set to $\overline{E}$ again, only when the value of the debounce status variable $x_E$ reaches the minimum value $W_{min}$ again.

In comparison with FIGS. 3 and 5, it can be seen that in this manner the input signal $x_{in}$ is debounced efficiently with a short delay.

Figure 6:
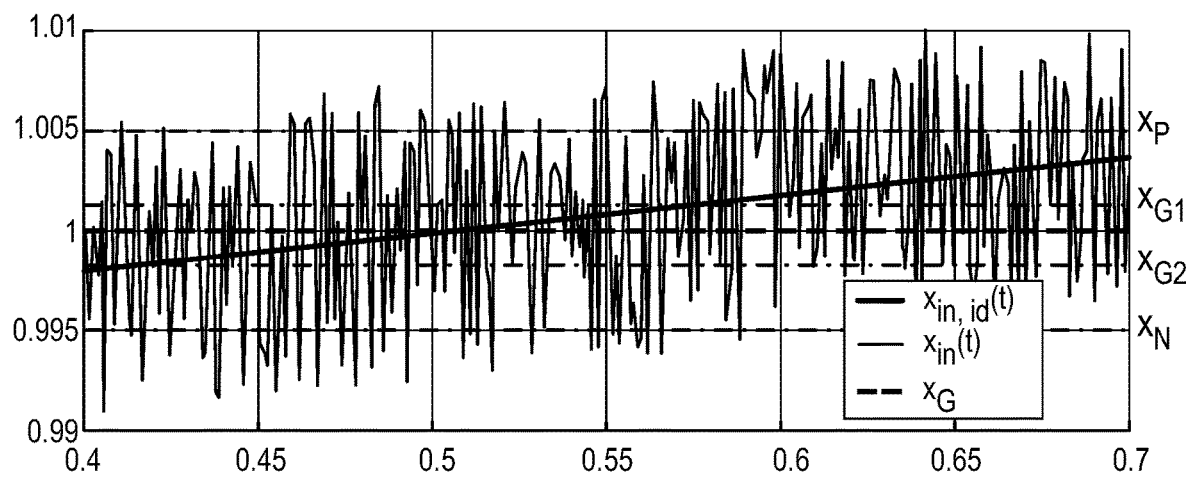
FIG. 6 shows a graph of the input signal plotted against time to illustrate further aspects of the method according to the invention.

FIG. 6 depicts a further graph of the input signal $x_{in}$ in a manner plotted against time, on the basis of which two further aspects, which can each be integrated into the method described above on their own or else in combination, are described below.

Unlike in the method described above, there is provision in this case not for a single limit value but rather for a first limit value $x_{G1}$ and a second limit value $x_{G2}$. The limit value $x_G$ is between the first limit value $x_{G1}$ and the second limit value $x_{G2}$.

While the present value of the input signal $x_{in}$ is between the first limit value $x_{G1}$ and the second limit value $x_{G2}$, the value of the debounce status variable $x_E$ remains unaltered.

Expressed in another way, the gradient of the debounce status variable $x_E$ is thus set to zero for as long as the present value of the input signal $x_{in}$ is between the first limit value $x_{G1}$ and the second limit value $x_{G2}$.

The first limit value $x_{G1}$ and the second limit value $x_{G2}$ thus define a dead band within which the debounce status variable $x_E$ does not change.

Otherwise, the method for debouncing the input signal $x_{in}$ proceeds analogously to that described above; wherein above the first limit value $x_{G1}$ the value of the debounce status variable $x_E$ is raised and below the second limit value $x_{G2}$ the value of the debounce status variable $x_E$ is lowered.

Alternatively or additionally, there is provision for a positive limit value $x_P$ and a negative limit value $x_N$. The positive limit value $x_P$ is greater than the limit value $x_G$ or than the first limit value $x_{G1}$, and the negative limit value $x_N$ is less than the limit value $x_G$ or than the second limit value $x_{G2}$.

The text below merely describes the case portrayed in FIG. 6, that is to say the case with the first limit value $x_{G1}$ and the second limit value $x_{G2}$. However, the explanations that follow also apply to the case of the single limit value $x_G$, apart from the dead band, which is then absent.

The multiple limit values $x_P$, $x_N$, $x_{G1}$ and $x_{G2}$ define five bands that each correspond to a fixed, predefined gradient of the debounce status variable.

To be more precise, the debounce status variable $x_E$ is raised with a constant primary first gradient if the present value of the input signal $x_{in}$ is between the first limit value $x_{G1}$ and the positive limit value.

If the present value of the input signal $x_{in}$ is greater than the positive limit value $x_P$, the debounce status variable $x_E$ is raised with a constant secondary first gradient that is greater than the primary first gradient.

If the present value of the input signal $x_{in}$ is between the negative limit value $x_N$ and the second limit value $x_{G2}$, the present value of the debounce status variable $x_E$ is lowered with a constant primary second gradient.

If the present value of the input signal $x_{in}$ is less than the negative limit value $x_N$, the debounce status variable $x_E$ is lowered with a constant secondary second gradient, the magnitude of which is greater than the magnitude of the primary second gradient.

Expressed in another way, the limit values $x_P$, $x_N$, $x_{G1}$ and $x_{G2}$ thus define the five bands within which the gradient of the debounce status variable $x_E$ is constant in each case, the gradient changing in the event of a transition between the bands, however.

Naturally, there may also be provision for more than five bands, for example by virtue of there being provision for multiple positive limit values and/or multiple negative limit values.

Preferably, the magnitude of the gradient of the debounce status variable $x_E$ increases with the distance from the limit value $x_G$ in this case too.

What is claimed is:

1. A method for debouncing an electrical input signal ($x_{in}$), having the following steps:
   receiving the input signal ($x_{in}$),
   ascertaining a present value of the input signal ($x_{in}$),
   ascertaining whether the present value of the input signal ($x_{in}$) is above or below at least one predefined limit value ($x_G$);
   producing a debounce status variable ($x_E$) having a defined initial value;
   altering the value of the debounce status variable ($x_E$) on the basis of at least whether the value of the input signal ($x_{in}$) is above or below the at least one limit value ($x_G$), wherein the value of the debounce status variable ($x_E$) is alterable between a minimum value ($W_{min}$) and a maximum value ($W_{max}$); and
   generating an output signal ($x_{out}$) on the basis of whether the value of the debounce status variable ($x_E$) corresponds to the minimum value ($W_{min}$), to the maximum value ($W_{max}$) or to a value between the minimum value ($W_{min}$) and the maximum value ($W_{max}$).

2. The method according to claim 1, wherein the output signal ($x_{out}$) is a binary signal.

3. The method according to claim 1, wherein the value of the output signal ($x_{out}$) is altered if the value of the debounce status variable ($x_E$) reaches the minimum value ($W_{min}$) or the maximum value ($W_{max}$).

4. The method according to claim 2, wherein the present value of the output signal ($x_{out}$) is maintained for as long as the value of the debounce status variable ($x_E$) is between the minimum value ($W_{min}$) and the maximum value ($W_{max}$).

5. The method according claim 3, wherein the value of the debounce status variable ($x_E$) is raised with a predefined first gradient if the ascertained present value of the input signal ($x_{in}$) is above the at least one limit value ($x_G$; $x_{G1}$), and/or the value of the debounce status variable ($x_E$) is lowered with a predefined second gradient if the ascertained present value of the input signal ($x_{in}$) is below the at least one limit value ($x_G$; $x_{G2}$).

6. The method according to claim 5, wherein the first gradient and/or the second gradient are or is ascertained on the basis of how far the present value of the input signal ($x_{in}$) is above or below the at least one limit value ($x_G$; $x_{G1}$, $x_{G2}$).

7. The method according to claim 6, wherein the magnitude of the value of the first gradient and/or of the second gradient is greater the further away the present value of the input signal ($x_{in}$) is from the at least one limit value $x_G$; $x_{G1}$, $x_{G2}$).

8. The method according to claim 6, wherein the first gradient and/or the second gradient is ascertained on the basis of a characteristic curve, wherein the characteristic curve assigns a gradient to the value of the input signal ($x_{in}$).

9. The method according to claim 7, wherein there is provision for at least one primary and one secondary first gradient and also at least one predetermined positive limit value ($x_P$) above the at least one limit value ($x_G$; $x_{G1}$), wherein the value of the debounce status variable ($x_E$) is raised with the primary first gradient if the ascertained present value of the input signal ($x_{in}$) is below the at least one positive limit value ($x_P$) but above the at least one limit value ($x_G$; $x_{G1}$) and wherein the value of the debounce status variable ($x_E$) is raised with the secondary first gradient if the ascertained present value of the input signal is above the at least one positive limit value ($x_P$); and/or in that there is provision for at least one primary and one secondary second gradient and also at least one predetermined negative limit value ($x_N$) below the at least one limit value ($x_G$; $x_{G2}$), wherein the value of the debounce status variable ($x_E$) is lowered with the primary second gradient if the ascertained present value of the input signal ($x_{in}$) is above the at least one negative limit value ($x_N$) but below the at least one limit value ($x_G$; $x_{G2}$) and wherein the value of the debounce status variable ($x_E$) is lowered with the secondary second gradient if the ascertained present value of the input signal ($x_{in}$) is below the at least one negative limit value ($x_N$).

10. The method according to claim 8, wherein there is provision for a first predefined limit value ($x_{G1}$) and a second predefined limit value ($x_{G2}$), wherein the value of the debounce status variable ($x_E$) is maintained for as long as the present value of the input signal is between the two limit values ($x_{G1}$, $x_{G2}$).

11. The method according to claim 10, wherein the value of the debounce status variable ($x_E$) is raised with the first gradient if the ascertained present value of the input signal ($x_{in}$) is above the greater of the two limit values ($x_{G1}$, $x_{G2}$) and/or the value of the debounce status variable ($x_E$) is lowered with the second gradient if the ascertained present value of the input signal ($x_E$) is below the smaller of the two limit values ($x_{G1}$, $x_{G2}$).

* * * * *